(12) United States Patent
Kirkpatrick et al.

(10) Patent No.: US 6,238,161 B1
(45) Date of Patent: May 29, 2001

(54) COST EFFECTIVE MODULAR-LINEAR WAFER PROCESSING

(75) Inventors: Thomas I. Kirkpatrick, Half Moon; Robert L. Otwell, San Jose, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/535,204

(22) Filed: Mar. 27, 2000

Related U.S. Application Data

(62) Division of application No. 08/924,388, filed on Sep. 5, 1997, now Pat. No. 6,053,687.

(51) Int. Cl.[7] .................................................. B65G 49/07
(52) U.S. Cl. ............................................. 414/217; 414/939
(58) Field of Search ............................... 414/217, 222.13, 414/416, 935, 939; 198/950

(56) References Cited

U.S. PATENT DOCUMENTS

| | | | |
|---|---|---|---|
| 3,584,847 | 6/1971 | Hammond, Jr. et al. | 414/939 X |
| 4,483,651 | * 11/1984 | Nakane et al. | 414/217 |
| 4,664,578 | 5/1987 | Kakehi | 414/217 |
| 4,701,251 | * 10/1987 | Beardow | 414/217 X |
| 4,722,298 | * 2/1988 | Rubin et al. | 414/217 X |
| 4,825,808 | 5/1989 | Takehashi et al. | 414/217 X |
| 4,851,018 | 7/1989 | Lazzari et al. | 414/939 X |
| 4,852,516 | 8/1989 | Rubin et al. | 118/715 |
| 5,024,570 | 6/1991 | Kiriseko et al. | 414/937 X |
| 5,110,249 | * 5/1992 | Norman | 414/222.13 X |
| 5,139,459 | 8/1992 | Takahashi et al. | 414/217 X |
| 5,163,832 | 11/1992 | Ishii et al. | 414/940 X |
| 5,178,639 | 1/1993 | Nishi | 414/940 X |
| 5,234,303 | 8/1993 | Koyano | 414/217 |
| 5,364,219 | 11/1994 | Takahashi et al. | 414/217 |
| 5,442,416 | 8/1995 | Tatayama et al. | 414/416 X |
| 5,443,346 | 8/1995 | Murata et al. | 414/416 X |
| 5,658,114 | * 8/1997 | Mahler | 414/217 |
| 5,700,127 | 12/1997 | Harada et al. | 414/939 X |
| 5,846,328 | 12/1998 | Aruga et al. | 414/935 X |
| 5,863,170 | * 1/1999 | Boitnott et al. | 414/222 |
| 5,976,258 | * 11/1999 | Kleiner | 414/935 X |

FOREIGN PATENT DOCUMENTS

| | | | |
|---|---|---|---|
| 2171119 | * 8/1986 | (GB) | 414/217 |
| 4046781 | 2/1992 | (JP) | 414/217 |

\* cited by examiner

Primary Examiner—James W. Keenan
(74) Attorney, Agent, or Firm—Dugan & Dugan LLP

(57) ABSTRACT

An inventive module and fabrication system for processing semiconductor devices reduces the overall cost per unit processed, by eliminating the need for expensive rotational robots. The modules and fabrication system are configured so that wafer handlers are required to travel only along linear paths. The inventive modules may include an integral conveyor or may couple a remote conveyor. Preferably, the conveyor is positioned normal to the wafer handler's transport path in order to achieve the most compact footprint.

7 Claims, 6 Drawing Sheets

COST EFFECTIVE MODULAR-LINEAR WAFER PROCESSING

This application is a division of U.S. patent application Ser. No. 08/924,388, filed Sep. 5, 1997, now U.S. Pat. No. 6,053,687.

FIELD OF THE INVENTION

The present invention relates generally to semiconductor wafer vacuum fabrication systems, and to an improved method and apparatus for increasing system productivity and reducing cost per unit processed.

BACKGROUND OF THE INVENTION

In the vacuum semiconductor wafer processing field, layout of the various system components such as load locks, process chambers, intermediate processes (e.g., pre-clean or cooldown) and transfer mechanisms (e.g., robots or conveyors) is critical to both system cost and reliability, as well as to footprint and productivity. Optimal component layout reduces wafer processing costs by eliminating the need for costly multi-axis wafer handlers, by reducing footprint and cleanroom costs associated therewith, by reducing the cost associated with non-value added wafer transport time, and by increasing reliability. Accordingly, much attention is directed to optimizing fabrication tool configuration so as to reduce the fabrication tool's footprint, and to simplify the wafer transfer process.

A conventional fabrication tool configuration is disclosed in U.S. Pat. No. 4,722,298 entitled "Modular Processing Apparatus for Processing Semiconductor Wafers," (the '298 patent). The '298 patent teaches a modular semiconductor wafer processing apparatus comprised of a plurality of modules. Each module has a chassis, a process chamber, a connection means for releasably connecting a service supply, and a rotational pick and place robot arm for extracting wafers from the process chamber. To form a modular semiconductor wafer processing system a plurality of the modular units are aligned such that the rotational pick and place robot arm of a first module picks up a first wafer from the first module and transports it to the second module where it is deposited for further processing. After processing is complete within the second module the rotational pick and place robot of the second module picks up the wafer and rotates, carrying it to the process chamber of a third module for further processing.

The '298 patent does not provide a detailed description of the process chamber configuration and of the robot arm operation. Presumably the process chamber would have two ports located on opposite sides of the chamber, an extraction port and an insertion port. In operation the rotational robot arm rotates to position itself in front of the extraction port of a first process chamber, the port opens and the robot arm extends, reaches into the process chamber, picks up the wafer, retracts and the port closes. The robot arm then rotates to position itself in front of the insertion port of a second process chamber. The port opens, the robot arm extends depositing the wafer within the second process chamber and then retracts. In this manner a wafer passes in one port of a process chamber, through the process chamber and out the port on the opposite side of the process chamber. Each process chamber is thereby exposed to ambient atmosphere (i.e., the atmosphere of the room in which the '298 semiconductor processing apparatus is located) during wafer transfer.

In order to move a wafer from one processing chamber to the next, many time consuming steps are necessary: (1) a first process chamber is most probably vented to ambient atmosphere; (2) the first process chamber's extraction port is opened; (3) the wafer is removed from the first process chamber; (4) a second process chamber's insertion port is opened; (5) the wafer is loaded into the second process chamber; (6) the second process chamber's insertion port is closed; and (7) the second process chamber is pumped down to the vacuum level required for processing. A wafer is therefore exposed to contaminants from the ambient atmosphere each time a wafer is transferred. Further, each time chamber pressure is altered, stationary particles can mobilize and therefore increase wafer contamination.

The modular configuration of the '298 patent advantageously allows a module to be quickly and easily replaced, thereby reducing downtime costs; and allows a fabrication tool to be easily reconfigured as processing requirements change. However, the '298 patent's configuration is strictly a serial wafer processing system—a wafer can only move from one processing module to the next adjacent module. Accordingly the '298 patent is limited to performance of a single processing sequence, any sequence change requires the entire apparatus to be shut down while processing modules are rearranged.

Further, the configuration taught by the '298 patent requires the use of a rotational pick and place robot within each module. Such robots are more expensive, less precise and require larger operating footprints than do conventional linear robots. The risk of wafer breakage, misplacement, etc., is also greater when using rotational robots than when using conventional linear robots. As well, the configuration of the '298 patent requires non-conventional, two-port process chambers and requires wafers to be transferred from a first wafer carrier to a second wafer carrier.

Because each wafer within a semiconductor fabrication facility is tracked by wafer carrier and wafer carrier slot number, a wafer which is not returned to the original carrier and its original slot becomes "lost." Therefore in practice, a system such as that disclosed in the '298 patent would require an external mechanism to move wafers back to their original wafer carrier and slot (increasing processing time, equipment costs and particle generation).

Accordingly, a need exists for an improved modular semiconductor device fabrication system that allows quick configuration and repair, that is less expensive, more precise, and smaller in footprint than conventional modular systems, and that is easily constructed using conventional process chambers and transfer mechanisms. Such a fabrication system should provide random access to processing chambers, thus enabling performance of a number of processing sequences, and should be capable of maintaining wafer carrier and wafer carrier slot integrity.

SUMMARY OF THE INVENTION

The present invention overcomes the problems described above by providing a semiconductor device processing module having a layout that eliminates the need for multi-axis rotational wafer handlers, that provides random access to each of the various processing chambers, That handles wafers in a vacuum environment, and that facilitates maintenance of wafer carrier and wafer carrier slot integrity. In a first aspect the present invention comprises a semiconductor device processing module comprising a chassis, a process chamber coupled to the chassis and a linear wafer handler (i.e., a wafer handler that performs only linear motion) operatively coupled to the process chamber. In a further aspect the linear wafer handler operatively couples the process chamber to a conveyor which may be a remote conveyor (i.e., not part of the module) or an integral conveyor (i.e., part of the module). In this aspect the linear wafer handler may be positioned within the conveyor chamber, within the process chamber, or within a chamber therebetween. In operation, a wafer is transported between adjacent modules by the conveyor and wafers are transferred to a process chamber by the respective linear wafer handler. In this manner the process chambers may be randomly accessed; each wafer may stop only at pre-selected process chambers. The wafer carrier remains in the loadlock while individual wafers are moved by the linear wafer handler from the wafer carrier, preserving wafer carrier and wafer slot integrity.

The conveyor may be modular wherein a given conveyor segment is preferably integral to the respective module, although a remote modular conveyor also may be employed. Alternatively, the modules may be rolled up to a conventional remote conveyor, and attached thereto. The conveyor is preferably positioned perpendicular to the transport path of the linear wafer handler. In this manner all wafer carrier/wafer transport is linear, making the inventive apparatus less expensive, capable of greater repeatability, and able to operate in a smaller footprint configuration than conventional modular semiconductor fabrication systems.

Because the inventive apparatus employs conventional processing chambers and wafer handlers, the present invention may be marketed without substantial lead time. Further the modules enable increased productivity as they may be interconnected to form semiconductor device fabrication systems without requiring significant wafer handler calibration time (as would be required for calibration of a rotational robot). Moreover, because the apparatus of the present invention requires simple wafer carrier/wafer transport paths, the conveyor and/or wafer handler of the present invention may comprise conventional magnetically levitated systems, thereby significantly reducing particle generation and wafer failure associated with such particle generation.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
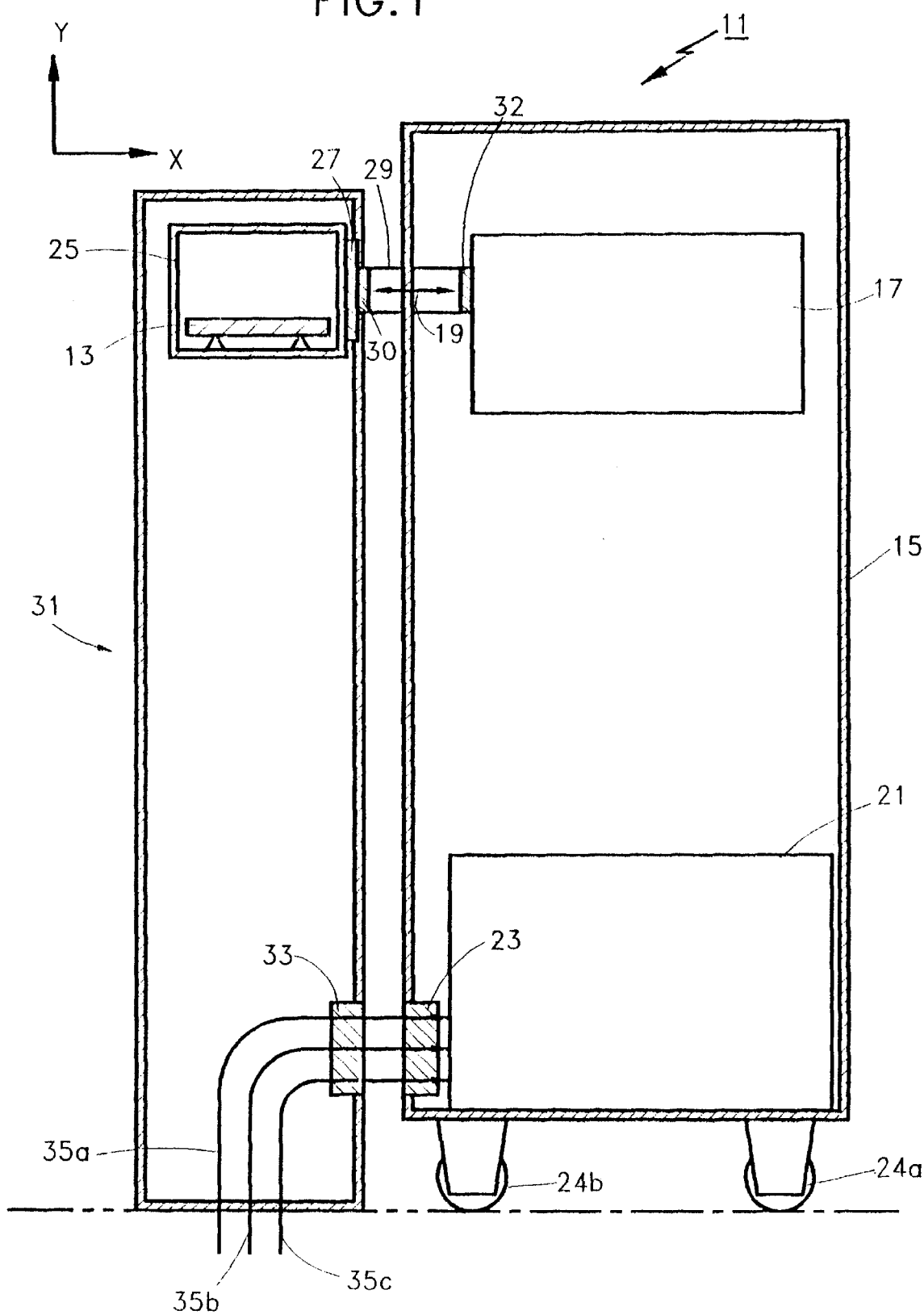
FIG. 1 is a side elevational view of a semiconductor device processing module illustrated in connection with a remote conveyor.

FIG. 1 is a side elevational view of a semiconductor device processing module 11 illustrated in connection with a remote conveyor 13. The module 11 comprises a chassis 15, a process chamber 17 coupled to the chassis 15, a linear wafer handler (e.g., an x-y axis robot or a magnetically levitated system) referenced generally by the number 19, a control panel 21, a facilities interface 23 and one or more rolling elements such as casters 24a–b. As shown in FIG. 1 the chassis 15 preferably encases or otherwise supports the process chamber 17.

The remote conveyor 13 may comprise any conventional conveyor for transferring wafers and is preferably contained within a conveyor chamber 25. The conveyor chamber 25 has two sealable ports (not shown) through which wafers enter and exit, and has one or more conveyor ports 27 through which the wafer handler 19 extends to extract wafers and to transfer them to the process chamber 17. Likewise the wafer handler 19 is preferably contained within a wafer handler chamber 29 with two sealable ports, an exterior port 30, and an interior port 32, through which the wafer handler 19 may extend to transfer wafers between the remote conveyor 13 and the process chamber 17.

The remote conveyor 13 may be part of a wafer transfer subsystem 31 further comprising a facilities port 33 positioned for allowing facilities conduits 35a–c to pass through the facilities port 33 and to operatively couple to the facilities interface 23. Whether the remote conveyor 13 is independent or part of a wafer transfer subsystem 31, the remote conveyor 13 is positioned for operative coupling to the process chamber 17. The operation of the module 11 of FIG. 1 will be described below with reference to FIG. 3.

Figure 2A:
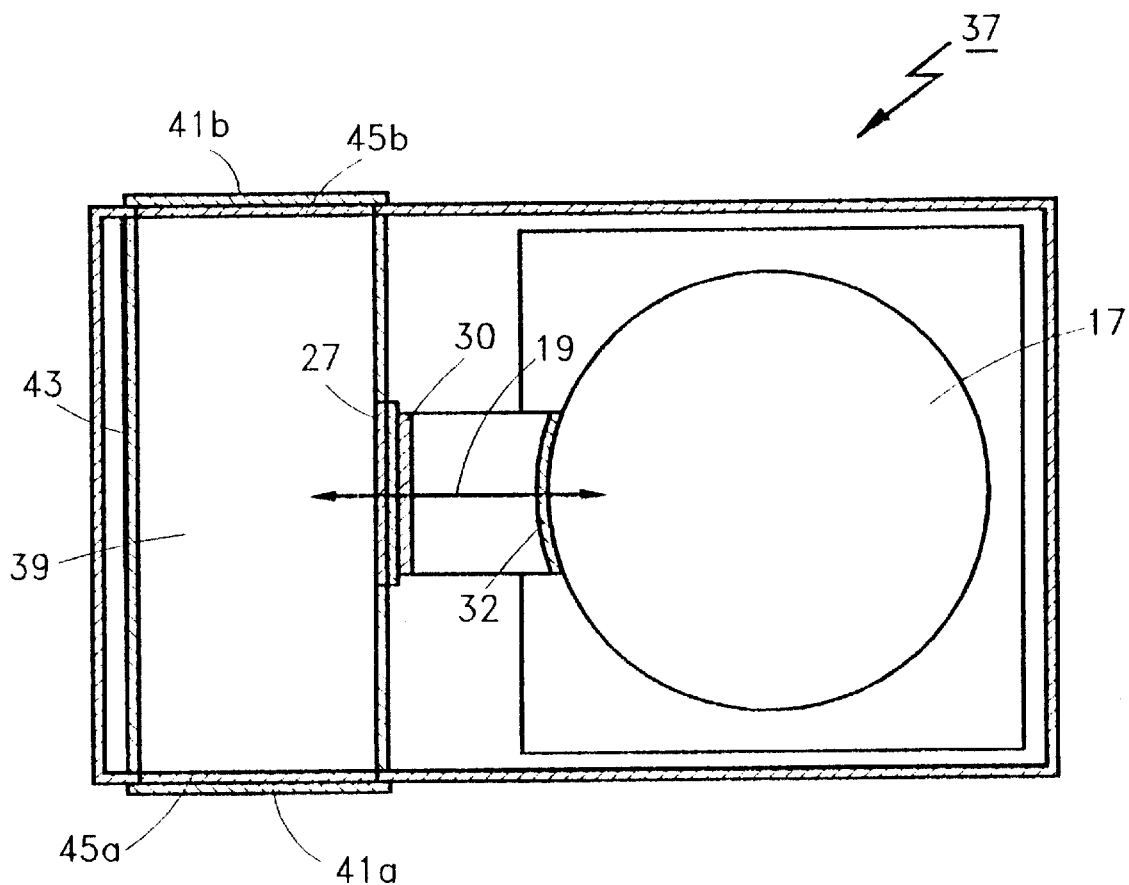
FIG. 2A is a top plan view of a semiconductor device processing module having an integral conveyor.
Figure 2B:
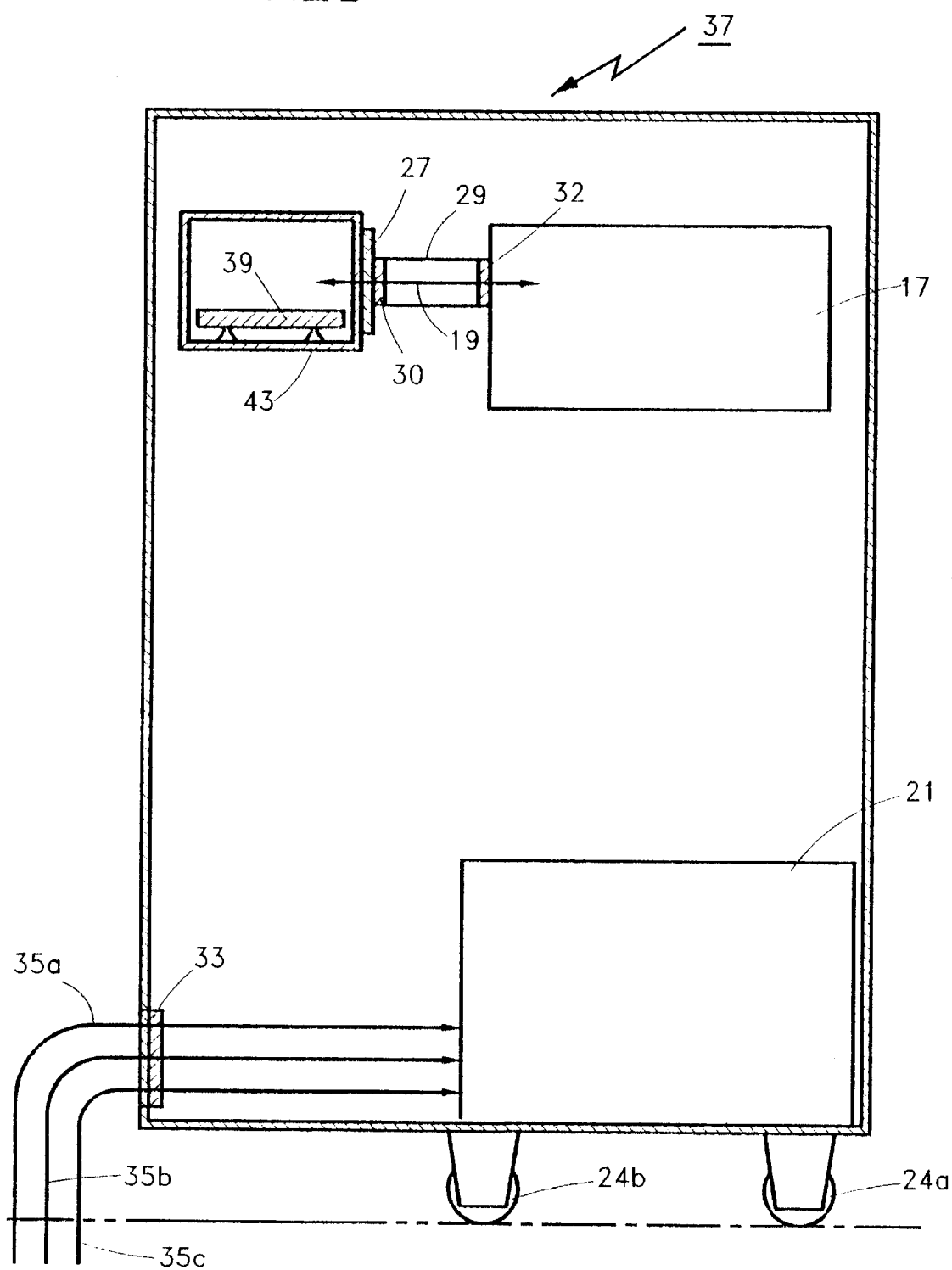
FIG. 2B is a side elevational view of the semiconductor device processing module of FIG. 2A.

FIG. 2A is a top plan view of integrated module 37 (i.e., a semiconductor device processing module) having an integral conveyor segment 39, and FIG. 2B is a side elevational view of the integrated module 37 of FIG. 2A. As shown in FIGS. 2A and 2B, the integral conveyor segment 39 is essentially the same as the remote conveyor 13 of FIG. 1. The integral conveyor segment 39, however, will preferably have a pair of intermodule transfer flanges 41a, 41b, one located at each end of the integral conveyor segment 39. Like the remote conveyor 13, the integral conveyor segment 39 maybe further contained within a conveyor chamber 43 having two sealable end ports through which wafers enter and exit, a first end port 45a and a second end port 45b. The intermodule transfer flanges 41a, 41b enable the integral conveyor segments 39 of adjacent integrated modules 37 to interface such that the respective end ports 45a, 45b of adjacent integrated modules 37 may open without exposing wafers in transport to the atmosphere and contaminants outside adjacent integral conveyor segments 39. Except for the integral conveyor segment 39, the integrated module 37 of FIGS. 2A and 2B is configured the same as the module 11 of FIG. 1.

Figure 3:
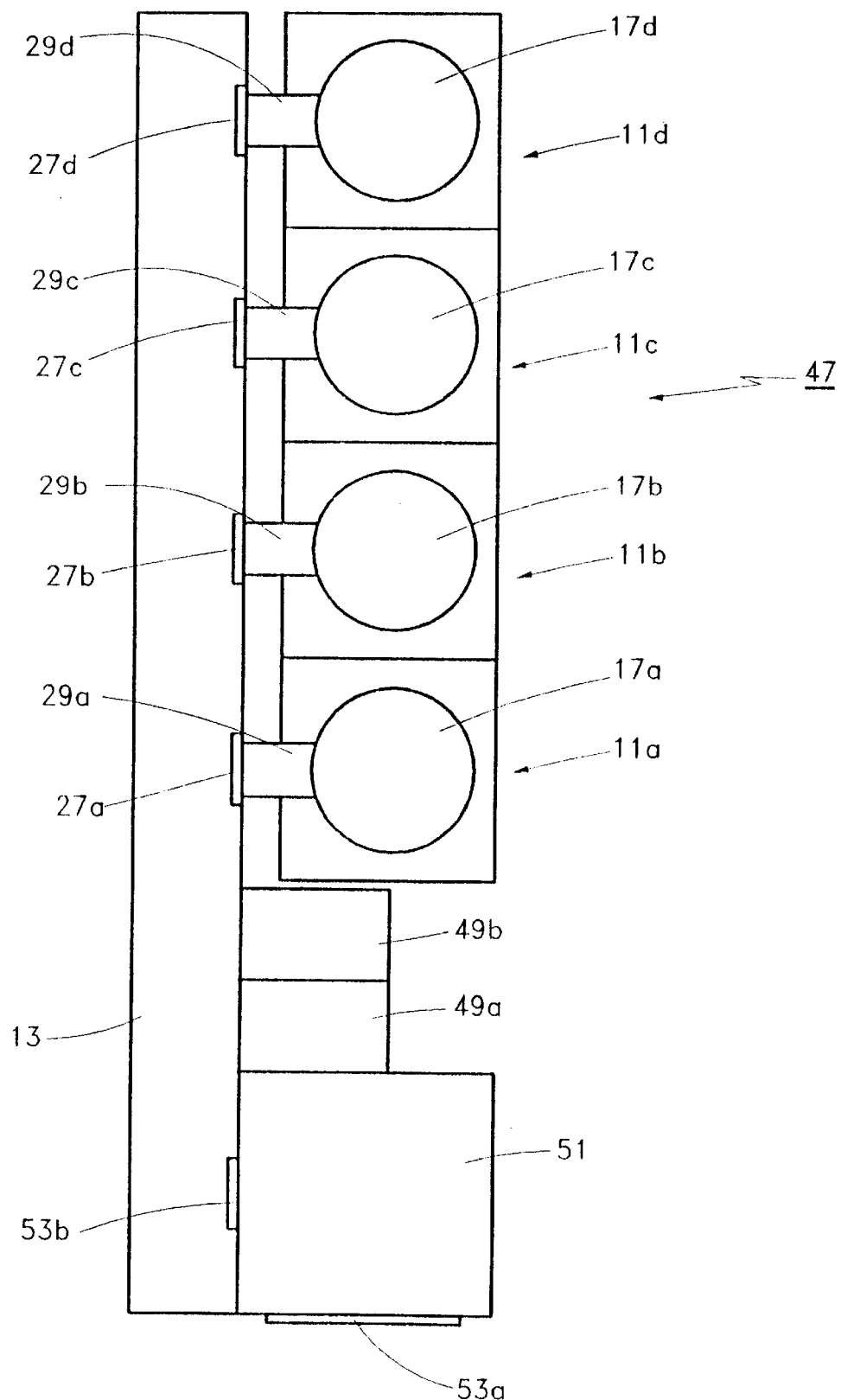
FIG. 3 is a top plan view of a semiconductor device processing system comprised of the inventive semiconductor device processing module of FIG. 1.

FIG. 3 is a top plan view of a modular semiconductor device processing system 47 comprised of a plurality of the inventive semiconductor device processing modules 11a–d of FIG. 1. The system 47 is preferably formed by rolling a first module 11a into position adjacent to a first conveyor port 27a of the remote conveyor 13. The module 11a is then operatively coupled to the remote conveyor 13 by a conventional fastener not shown. The fastener maintains the module 11a and the remote conveyor 13 in a predetermined position such that the portion of the wafer handler chamber 29 which extends away from the process chamber 17 aligns with the conveyor port 27 of the conveyor chamber 25 (shown in FIG. 1). The wafer handler's exterior port 30 and the conveyor port 27 are connected so that both the wafer handler's exterior port 30 and the conveyor port 27 may be opened simultaneously without exposing a wafer to atmospheres other than those of the conveyor chamber 25 and the wafer handler chamber 29, thus minimizing the risk of wafer contamination.

In the same manner, a second, third and fourth module 11b, 11c, and 11d are rolled into position adjacent a second, third and fourth conveyor port 27b, 27c and 27d respectively of the wafer transfer subsystem 31 and are coupled thereto. The system 47 may also comprise one or more orient or cool down chambers 49a, 49b and a load lock 51. Preferably the load lock 51 has two ports, a first port 53a, and a second port 53b. The orient or cooldown chambers may be configured like the module 11 described with reference to FIG. 1, but would not require the process chamber 17.

In operation, a wafer carrier is loaded through the first port 53a to the load lock 51. The first port 53a is closed and the loadlock 51 is pumped-down to processing vacuum conditions or to the vacuum condition maintained in the conveyor chamber 25. The second port 53b is then opened and a conventional wafer handler (not shown) transports wafers from the wafer carrier to the remote conveyor 13. Assuming the steps of orient and cool down are not required, the wafers travel along remote conveyor 13 until reaching the module 11a. When a wafer is aligned with the first conveyor port 27a, the wafer stops and the conveyor port 27 and the wafer handler's exterior port 30 open and the wafer handler 19 extends therethrough to pickup a wafer.

In order to pick up a wafer, the wafer handler 19 will extend in an x-axis movement to a position just below the wafer. The wafer handler 19 will then elevate moving along the y-axis a distance sufficient to contact the wafer, lifting the wafer off the conveyor such that it is supported by the wafer handler 19. The wafer handler 19 retracts, the conveyor port 27 and the wafer handler's exterior port 30 close, the wafer handler's interior port 32 and the process chamber port (not shown) open, and the wafer handler extends therethrough moving along the x-axis to a position above the processing platform. The wafer handler then lowers, moving along the y-axis a distance such that the wafer contacts processing platform pins and is thereby lifted off the wafer handler 19. Thus the wafer is deposited within the process chamber 17 for processing, the wafer handler 19 retracts and the wafer handler's interior port 32 and the process chamber port close.

After processing is complete the wafer handler 19 transports the wafer from the process chamber 17 to the remote conveyor 13. Thereafter the wafer travels along the remote conveyor 13 being transported to and from each required process chamber as above described. After the wafer has been processed within the last required module (in this example the module 11d) the wafer may return to the wafer carrier within the load lock 51. When all of the wafers have been processed and have been returned to the wafer carrier, the second port 53b is closed, the loadlock 51 is vented-up to atmospheric conditions, and the first port 53a is opened for removal of the wafer carrier. Alternatively, the system 47 may comprise an additional loadlock (not shown) preferably located at the end of the system 47 opposite the loadlock 51. With two loadlocks, one loadlock can be loading and unloading wafer carriers while wafers from the other loadlock are being processed in the processing modules of the system 47. Thus the wafer throughput of the system 47 is improved as process modules are not idle while wafer carriers are loaded and unloaded from the loadlocks.

Figure 4:
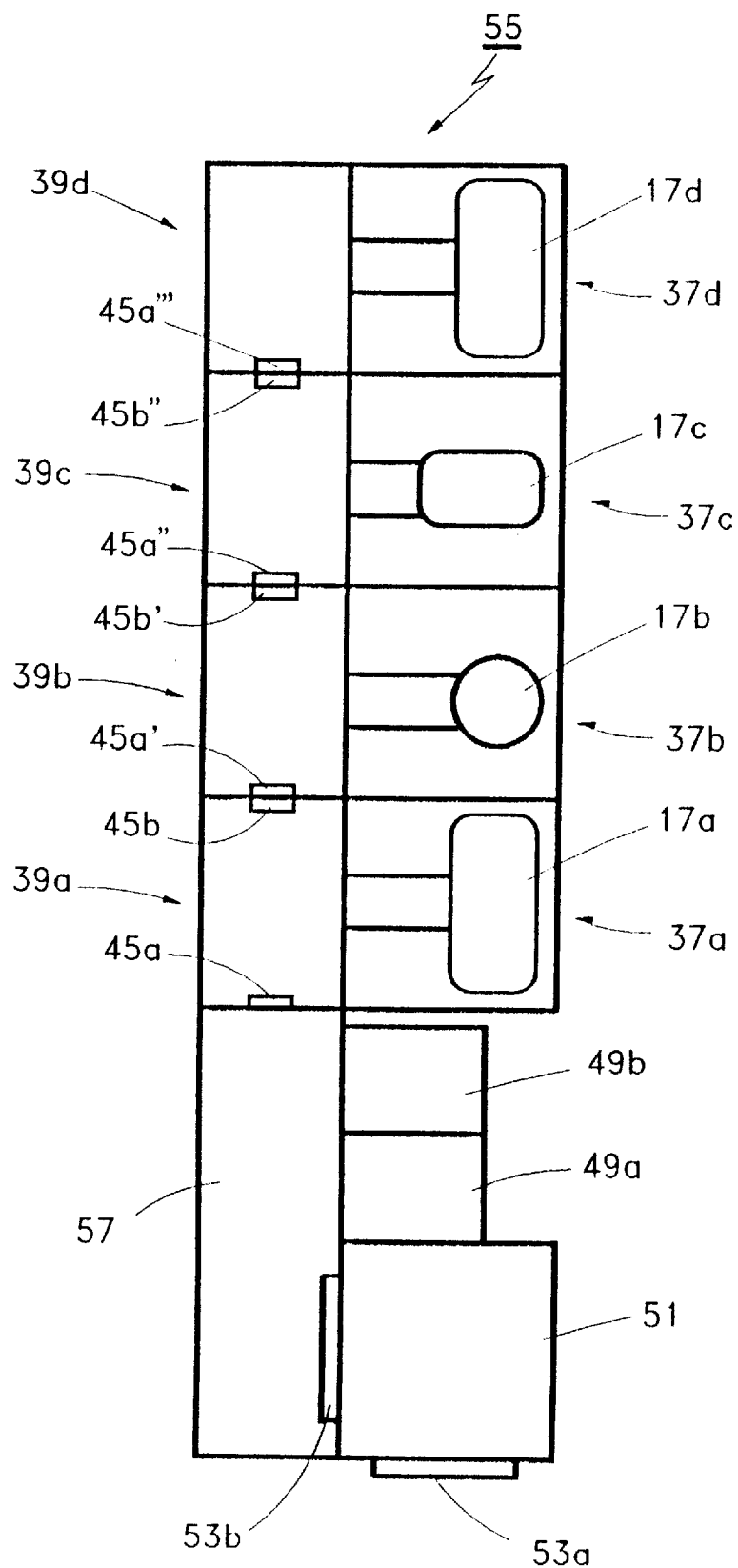
FIG. 4 is a top plan view of a semiconductor device processing system comprised of the inventive semiconductor device processing module of FIG. 2.

FIG. 4 is a top plan view of a semiconductor device processing system 55 comprised of a plurality of the inventive integrated module 37 of FIGS. 2A and 2B. The system 55 is preferably formed by rolling a plurality of integrated modules 37 into position adjacent each other such that the intermodule transfer flange 41a of the first integrated module 37 operatively connects the intermodule transfer flange 41b of an adjacent integrated module 37. Thus, the end port 45a of the first integrated module 37 and the end port 45b of the adjacent integrated module 37 may be open simultaneously to allow wafer carriers to pass from the first integrated module 37 to the next adjacent model 37 with minimized risk of contamination. When the integrated modules 37 are disconnected the end ports 45a and 45b may be closed to prevent contaminants from entering the conveyor chamber 43. The plurality of integrated modules 37 may be further coupled to one or more load locks 51, and to one or more orient or cool down chambers 49a, 49b via a conveyor portion 57 which operatively couples the integral conveyor segments 39 via the intermodule transfer flanges 41a, 41b or via other conventional methods.

Once configured, the system 55 of FIG. 4 operates the same as the system 47 of FIG. 3 with the additional option of either opening and closing the end ports 45a, 45b as each wafer passes (thereby further reducing the risk of contamination) or leaving the end ports 45a, 45b continuously open during operation. As shown by FIG. 4, the length of the integral conveyor may vary depending on the size of the corresponding process chamber. This feature reduces the amount of wasted space and non-value added transfer time between adjacent modules.

Figure 5:
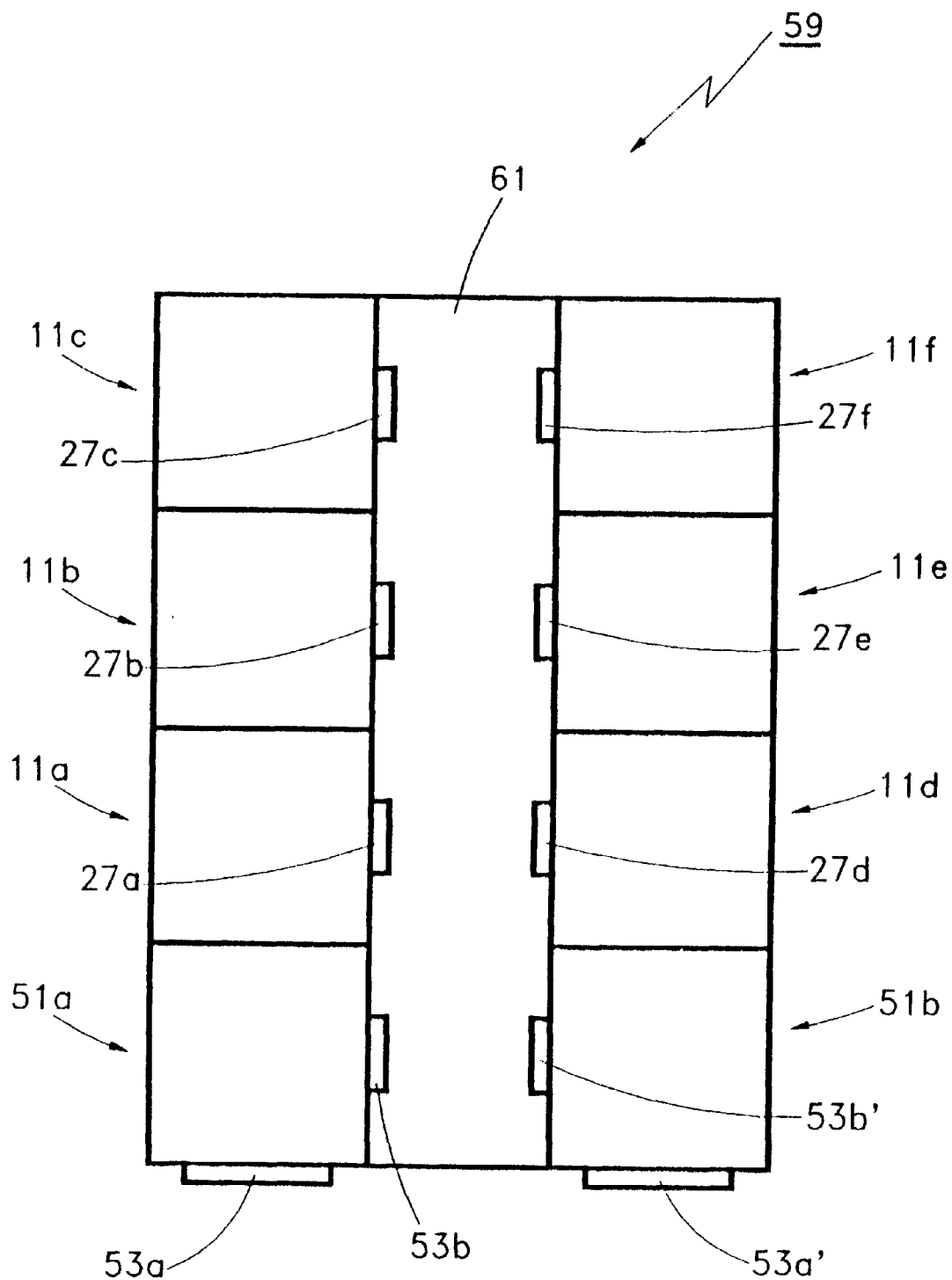
FIG. 5 is a top plan view of a semiconductor device processing system comprised of the inventive semiconductor device processing modules of FIG. 1.

FIG. 5 is a top plan view of a semiconductor processing system 59 comprised of a plurality of the inventive module 11 of FIG. 1 and a dual-access remote conveyor 61. The dual-access remote conveyor 61 is similar to the remote conveyor 13 of FIG. 1, but is configured with opposing sealable ports 27 through which wafers enter and exit either side of the remote conveyor 61. The system 59 is preferably formed by rolling a first module 11a into position adjacent to a first conveyor port 27a of the dual access remote conveyor 61. The module 11a is then operatively coupled to the dual access remote conveyor 61 at port 27a as in the processing system 47 of FIG. 3. In the same manner, a second, third, fourth, fifth, and sixth module 11b, 11c, 11d, 11e, and 11f are rolled into position adjacent conveyor ports 27b, 27c, 27d, 27e, and 27f, respectively, and are coupled thereto.

A first and second load lock 51a, 51b are attached to the dual access remote conveyor 61. The first and second load locks 51a and 51b have first and second external ports 53a and 53a' for loading and unloading wafer carriers and have first and second ports 53b and 53b' through which wafers enter and exit the dual-access remote conveyor 61. In operation, wafers will pass along the dual-access conveyor 61 as described with reference to FIG. 3, and will be transported between the dual-access conveyor 61 and a given process chamber as described with reference to FIG. 1.

As shown in FIG. 5, the contralateral positioning of the processing modules provides a very compact footprint, and allows for a direct hand off between contralaterally positioned modules having similar atmospheres. Both the compact footprint and the direct handoff capability further reduce non-value added wafer transport time.

The inventive modules disclosed herein employ linear wafer handlers for transporting wafers between the wafer transport system (e.g., the conveyor) and the process chambers. The wafer transport system is preferably positioned normal to the wafer handler transport path in order to achieve the most compact footprint, and to increase repeatability. Although any conventional wafer transport system, and any conventional wafer handler could be employed, the linear transport paths are particularly well suited to the use of magnetic levitation such as those conventionally known in the art.

It is understood that the configurations and operating descriptions provided above are merely exemplary, as the foregoing description discloses only the preferred embodiments of the invention. Modifications of the above disclosed apparatus and method which fall within the scope of the invention will be readily apparent to those of ordinary skill in the art. For instance, the inventive fabrication system may contain any number of modules and the conveyor may assume a number of alternative shapes. The length of the wafer handler chamber may vary, and need not extend beyond the chassis. As well, the inventive fabrication system may be configured so as to provide a staged vacuum, thus enabling ultra-high vacuum levels in process chambers located at the rear of the fabrication system.

In operation, a given wafer need not stop at each module, but may be selectively processed as required (i.e., the inventive fabrication system allows random access to the various process modules). Because the fabrication system of the present invention allows random access to the various processing modules, the system may simultaneously process semiconductor devices requiring different process specifications.

As the above described example demonstrates, within the inventive module the wafer handler is only required to move along the x and y axis. Alternatively, however, by employing a lift/lower mechanism within the conveyor and lift/lower pins within the process chamber, the wafer handler would not be required to move along the y axis.

It is understood that each module may contain the support equipment necessary for operation of the modules various components, or could interface with remote support equipment.

Accordingly, while the present invention has been disclosed in connection with the preferred embodiments thereof, it should be understood that other embodiments may fall within the spirit and scope of the invention, as defined by the following claims.

The invention claimed is:

1. A semiconductor device processing module comprising:

a single process chamber;
        a single linear wafer handler operatively coupled to said single process chamber, said single linear wafer handler being isolatable from said single process chamber;
        an integral conveyor operatively coupled to said single process chamber by said single linear wafer handler;
        a chassis that surrounds both the single process chamber and the single linear wafer handler so as to define the module; and
        a single opening in the single process chamber through which a wafer may enter and exit the single process chamber.

2. The semiconductor device processing module of claim 1 wherein said single linear wafer handler is adapted to move only along an x-axis and a y-axis.

3. The semiconductor device processing module of claim 2 wherein said integral conveyor is a magnetically levitated system.

4. The semiconductor device processing module of claim 1 wherein said integral conveyor comprises a lift/lower mechanism for facilitating wafer transfer to said linear wafer handler.

5. The semiconductor device processing module of claim 4 wherein said integral conveyor is a magnetically levitated system.

6. The semiconductor device processing module of claim 4 wherein said integral conveyor is positioned perpendicular to a transport path of said linear wafer handler.

7. The semiconductor device processing module of claim 1 wherein said integral conveyor is positioned perpendicular to a transport path of said linear wafer handler.

* * * * *